United States Patent
Salazar (10) Patent No.: US 11,573,623 B2
(45) Date of Patent: *Feb. 7, 2023

(54) TRUE POWER SHEDDING

(71) Applicant: Shenzhen Chipuller Chip Technology Co., LTD, Shenzhen (CN)

(72) Inventor: Mathew Salazar, Mountain View, CA (US)

(73) Assignee: Shenzhen Chipuller Chip Technology Co., LTD, Shenzhen (CN)

( * ) Notice: Subject to any disclaimer, the term of this patent is extended or adjusted under 35 U.S.C. 154(b) by 50 days.

This patent is subject to a terminal disclaimer.

(21) Appl. No.: 17/166,972

(22) Filed: Feb. 3, 2021

(65) Prior Publication Data

US 2021/0157391 A1 May 27, 2021

Related U.S. Application Data

(63) Continuation of application No. 16/382,069, filed on Apr. 11, 2019, now Pat. No. 10,955,905.

(60) Provisional application No. 62/662,598, filed on Apr. 25, 2018, provisional application No. 62/656,344, filed on Apr. 11, 2018.

(51) Int. Cl.
*G06F 1/3287* (2019.01)
*G06F 1/3234* (2019.01)
*G06F 1/26* (2006.01)
*H01L 23/50* (2006.01)

(52) U.S. Cl.
CPC ............ *G06F 1/3287* (2013.01); *G06F 1/266* (2013.01); *G06F 1/325* (2013.01); *H01L 23/50* (2013.01)

(58) Field of Classification Search
CPC ........ G06F 1/3287; G06F 1/325; G06F 1/266; G06F 1/3206; H01L 23/50; H01L 25/0657; H01L 25/0652; H01L 25/18; H01L 2225/06572; H01L 2225/06541
See application file for complete search history.

(56) References Cited

U.S. PATENT DOCUMENTS

| 6,130,813 | A | 10/2000 | Kates et al. |
| 7,498,694 | B2 | 3/2009 | Luo et al. |
| 8,058,897 | B1* | 11/2011 | Lu ........................ H03K 19/177 326/38 |

(Continued)

OTHER PUBLICATIONS

Final Office Action dated Jul. 9, 2020 for U.S. Appl. No. 16/382,069.
(Continued)

*Primary Examiner* — Thienvu V Tran
*Assistant Examiner* — Shahzeb K Ahmad
(74) *Attorney, Agent, or Firm* — Mughal IP P.C.

(57) ABSTRACT

Described herein are mechanisms and methods for blocking the propagation of signals to Integrated Circuit (IC) components that have been power gated, rather than simply suffering from leakage through signals that might not be parked in a low state. In some embodiments, switches that block the flow of current in such signals may enable turning off power to any IC component and not just to circuits on an IC component that make sole use of protocols that are friendly to power gating. This may advantageously increase power savings, by permitting more portions of a system in an idle state to be power gated, or by reducing or eliminating leakage in signals on boundaries of blocks being power gated, or both.

20 Claims, 4 Drawing Sheets

(56) References Cited

U.S. PATENT DOCUMENTS

| | | | | |
|---|---|---|---|---|
| 10,396,778 B1* | 8/2019 | Narayan | ............ | H03K 19/0016 |
| 2011/0245988 A1* | 10/2011 | Ingels | ...................... | H02J 3/14 |
| | | | | 700/295 |
| 2014/0097702 A1* | 4/2014 | Upputuri | ............ | H03K 19/0016 |
| | | | | 307/115 |
| 2014/0210097 A1 | 7/2014 | Chen et al. | | |
| 2016/0241126 A1* | 8/2016 | Vaidya | .................. | H02M 3/158 |
| 2018/0102776 A1* | 4/2018 | Chandrasekar | ......... | H01L 25/18 |
| 2018/0309311 A1* | 10/2018 | Schaef | ................... | H02M 3/07 |
| 2019/0250853 A1* | 8/2019 | Arbel | ....................... | G06F 1/28 |

OTHER PUBLICATIONS

Notice of Allowance dated Oct. 28, 2020 for U.S. Appl. No. 16/382,069.
Advisory Action dated Oct. 16, 2020 for U.S. Appl. No. 16/382,069.
Non-Final Office Action dated Jan. 10, 2020 for U.S. Appl. No. 16/382,069.

\* cited by examiner

TRUE POWER SHEDDING

CLAIM OF PRIORITY

This is a Continuation of, and claims the benefit of priority to U.S. patent application Ser. No. 16/382,069, filed Apr. 11, 2019, and now issued U.S. Pat. No. 10,955,905 on Mar. 23, 2021, which claims the benefit of priority to U.S. Provisional Patent Application No. 62/656,344, filed Apr. 11, 2018, and to U.S. Provisional Patent Application No. 62/662,598, filed Apr. 25, 2018, all of which are incorporated by reference in their entirety.

BACKGROUND

Various electronic systems may operate at low power, such as mobile and battery powered systems. Load switching may be one approach to reducing leakage power in portions of a system to be shut off when those portions are not being used. However, load switching may not be sufficient to entirely reduce leakage power in those portions of the system.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

Various embodiments may comprise metal oxide semiconductor (MOS) transistors, which may include drain, source, gate, and bulk terminals. However, other types of transistors may be used without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Portable electronics, such as cell phones, wearable devices, and a wide range of Internet-of-Things (IoT) devices, are becoming more common. Such devices may be battery powered. Reducing the power they consume may increase the amount of time between either recharging or replacing the batteries in the device. Meanwhile, many of these devices, and/or specific blocks of these devices, may merely be used intermittently, so minimizing power drawn by those devices and/or blocks during periods of inactivity may help to maximize battery lifetime.

Inactive devices or blocks may be "turned off" in a variety of ways that may differ with respect to the amounts of power that they can save. Since most digital logic is Complementary Metal Oxide Semiconductor (CMOS) based logic, and CMOS-based logic may draw very little power when it is not switching, one technique to save power may be to stop the propagation of clock signaling to blocks that are not active (e.g., "clock gating"). On one hand, clock signals may be relatively quick to turn off and turn back on (e.g., to gate and un-gate), and implementing logic to do so may be relatively simple. On the other hand, such logic might not eliminate leakage power of a device or a block, and might not save power consumption from circuits that draw steady-state power.

Figure 1:
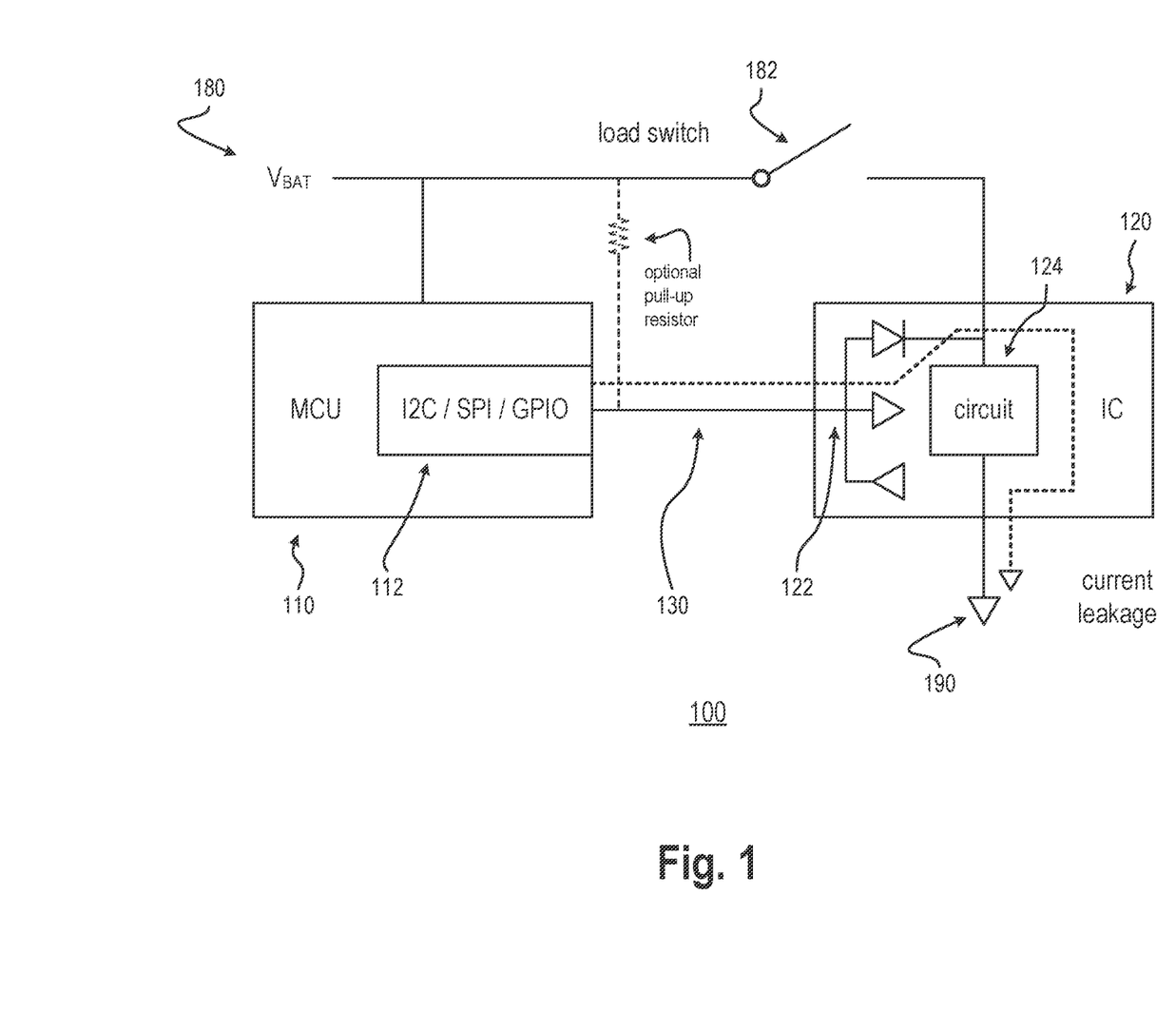
FIG. 1 illustrates components of a system incorporating a single load switch.

FIG. 1 illustrates components of a system incorporating a single load switch. A system 100 (which may be an embedded system, e.g., in a portable device, a wearable device, or an IoT device) may comprise a microcontroller unit (MCU) 110 and an Integrated Circuit (IC) component 120. MCU 110 may have one or more MCU interface ports 112, which may be connected to a signal interface 130 (which may be, e.g., an Inter-Integrated Circuit (I2C) compliant interface, a Serial Peripheral Interface (SPI) compliant interface, or a General Purpose Input Output (GPIO) interface). In turn, signal interface 130 may be connected to one or more respectively corresponding IC component interface ports 122. IC component 120 may have one or more internal circuits 124 making use of IC component interface ports 122 (and through them, making use of signal interface 130).

A supply voltage 180 (which may be, e.g., a voltage $V_{BAT}$ provided by a battery) may be connected to both MCU 110 and IC component 120, and a ground voltage 190 may also be connected to MCU 110 and/or IC component 120. IC component 120 may be cut off from supply voltage 180 when a load switch 182 is configured to create an open circuit between supply voltage 180 and IC component 120.

In comparison with clock gating, turning off or gating a power supply for inactive devices or blocks, as depicted with load switch 182 in FIG. 1, may be a more thorough way of eliminating power dissipation from inactive circuitry. An advantage of such switches is that they may block all of the current being drawn from a power supply. However, although the use of load switches may be intended to eliminate power draw from an IC component (e.g., a silicon chip, or die) that has been disconnected from a power supply, putting a load switch between the power supply and a power supply pin for the IC component may not always accomplish that end.

One potential disadvantage of merely using a load switch (e.g., a single load switch) to disconnect an IC component from a power supply is that the IC component might not be sufficiently power gated, which may occur due to signal lines that may still be connected. In addition, not all IC components have external clocks that can be gated. Moreover, not all IC components are primarily digital logic; some IC components may be mixed-signal chips (e.g., having both digital logic and analog circuitry), which may draw a bias current.

Another potential disadvantage is that the task of turning off a power supply may be slower than the task of turning a clock off—and the task of turning on the power supply may be much slower than the task of turning the clock back on. This may be because bigger loads are being switched and/or because turning on IC power supplies too quickly may trigger built-in Electro-Static Discharge (ESD) protection on a power supply. The end result may be that substantial amounts of power are wasted.

Yet another potential disadvantage is that input signals and output signals on a modern IC component may include embedded ESD diodes, to prevent signals from overshooting a power supply level or undershooting a ground voltage level. If the active part of the system is trying to pull such a signal high, then these diodes may conduct current and may try to power up the IC component by drawing power from the signal. In some designs, such undesirable power consumption may be addressed by "parking" signals going to blocks in an idle state. This may primarily be possible when communication protocols used to interact with the IC component permit such behavior.

Still another potential disadvantage is that leakage current may still find a path through the IC component. For example, leakage current may find a path between a signal interface and a ground voltage (or between the signal interface, the ground voltage, and/or another supply voltage).

Accordingly, described herein are mechanisms and methods for true power shedding, which may incorporate switchable electrical connections for IC components that may be power gated (such as signal interfaces, ground voltages, and/or other supply voltages). Blocking the switchable electrical connections (e.g., by gating the electrical connections, or creating open circuits in the electrical connections) may advantageously reduce or eliminate leakage through signal interfaces that might not be parked in a low state. In some embodiments, switches that block the flow of current in such signals may enable turning off power to any of a variety of IC components (and not just to circuits on an IC component that make sole use of protocols that are friendly to power gating). This may advantageously increase power savings by permitting more portions of system that are in an idle state to be power gated, or by reducing or eliminating leakage in signals on boundaries of blocks being power gated, or both.

In some embodiments, leakage power of portions of the system (e.g., IC components within the system) may be completely shut off when those portions are not being used. As a result, an advantage of true power shedding may be increased power reduction for an IC component, up to and including complete power reduction for an IC component (e.g., by leaving an IC component completely floating).

Figure 2:
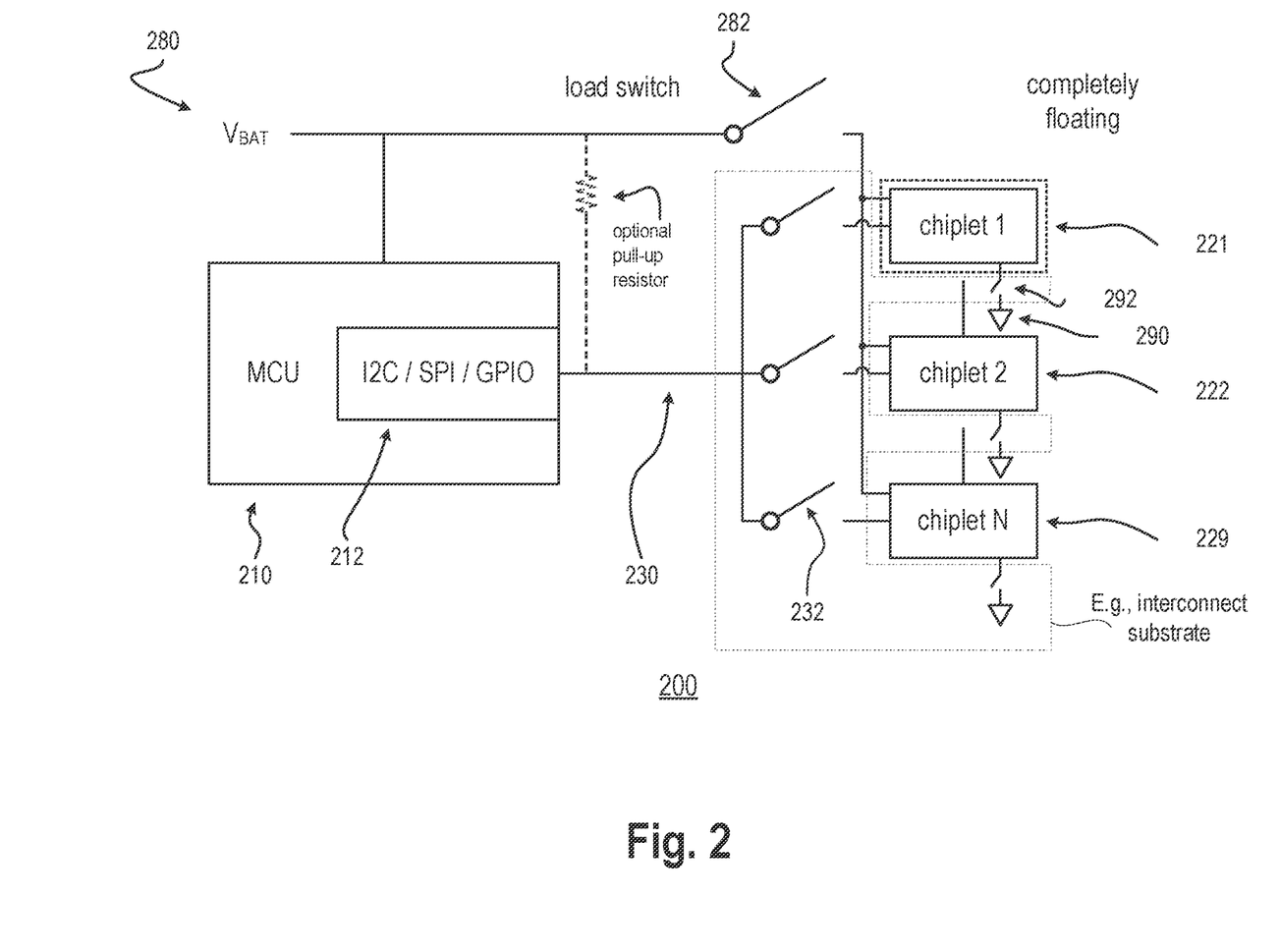
FIG. 2 illustrates components of a system incorporating a load switch and additional switches to eliminate potential leakage paths through signals and ground, in accordance with some embodiments of the disclosure.

FIG. 2 illustrates components of a system incorporating a load switch and additional switches to eliminate potential leakage paths through signals and ground, in accordance with some embodiments of the disclosure. A system 200 (which may be an embedded system) may comprise an MCU 210 and one or more IC components (e.g., "chiplets"), such as a first IC component 221, a second IC component 222, and so on, up to an Nth IC component 229. MCU 210 may have one or more MCU interface ports 212, which may be connected to a signal interface 230 (which may be, e.g., an I2C-compliant interface, an SPI-compliant interface, or a GPIO interface). In turn, signal interface 230 may be connected to IC component interface ports on one or more of first IC component 221 through Nth IC component 229.

A supply voltage 280 (which may be, e.g., a voltage $V_{BAT}$ provided by a battery) may be connected to MCU 210 and one or more of first IC component 221 through Nth IC component 229. A ground voltage 290 may also be connected to MCE 210 and one or more of first IC component 221 through Nth IC component 229 (and one or more additional supply voltages may be connected to any of first IC component 221 through Nth IC component 229 as well).

First IC component 221 through Nth IC component 229 may be cut off from supply voltage 280 when a load switch 282 is configured to create an open circuit between supply voltage 280 and first IC component 221 through Nth IC component 229. In addition, for system 200, any of first IC component 221 through Nth IC component 229 may be cut off from signal interface 230 when one or more signal interface switches 232 are configured to create open circuits between the IC components and signal interface 230. Any of first IC component 221 through Nth IC component 229 may also be cut off from ground voltage 290 when one or more ground switches 292 are configured to create open circuits between the IC components and ground voltage 290. In addition, any of first IC component 221 through Nth IC component 229 may be cut off from another supply voltage when one or more other switches are configured to create open circuits between the IC components and the other supply voltage.

Accordingly, in various embodiments, switches may be introduced not merely on a power supply, but also on ground connections and/or on signal interfaces (e.g., data signals and/or control signals) of one or more IC components to be shut off. In an operating state, these switches may be closed and may permit power, ground, and/or signal values to propagate to and from the IC components. When these devices or blocks are in an idle state, the switches may then be opened, and all leakage current—including any that might flow through the signals and/or ground connections—may be cut off. When the time comes to wake up an IC component (e.g., from the idle state to the operating state), the switches may be closed again, thereby reconnecting the circuit to ground, power, and signals, and thereby to the remainder of the system.

In some embodiments, special sequencing requirements may be enforced through the switches. For example, a switch for ground may be closed first, followed by one or more switches for input signals to the chip, followed by a switch for a power supply, and finally followed by one or more switches for outputs from the chip. Such sequences may limit or prevent the driving of signals from the chip while it is in an indeterminate state (e.g., while powering up) from propagating to the remainder of the system where they might cause unintended consequences. In some embodiments, an optional pull-up resistor may be incorporated (e.g., between a power supply line and a signal interface), which may depend upon the interface used.

Figure 3:
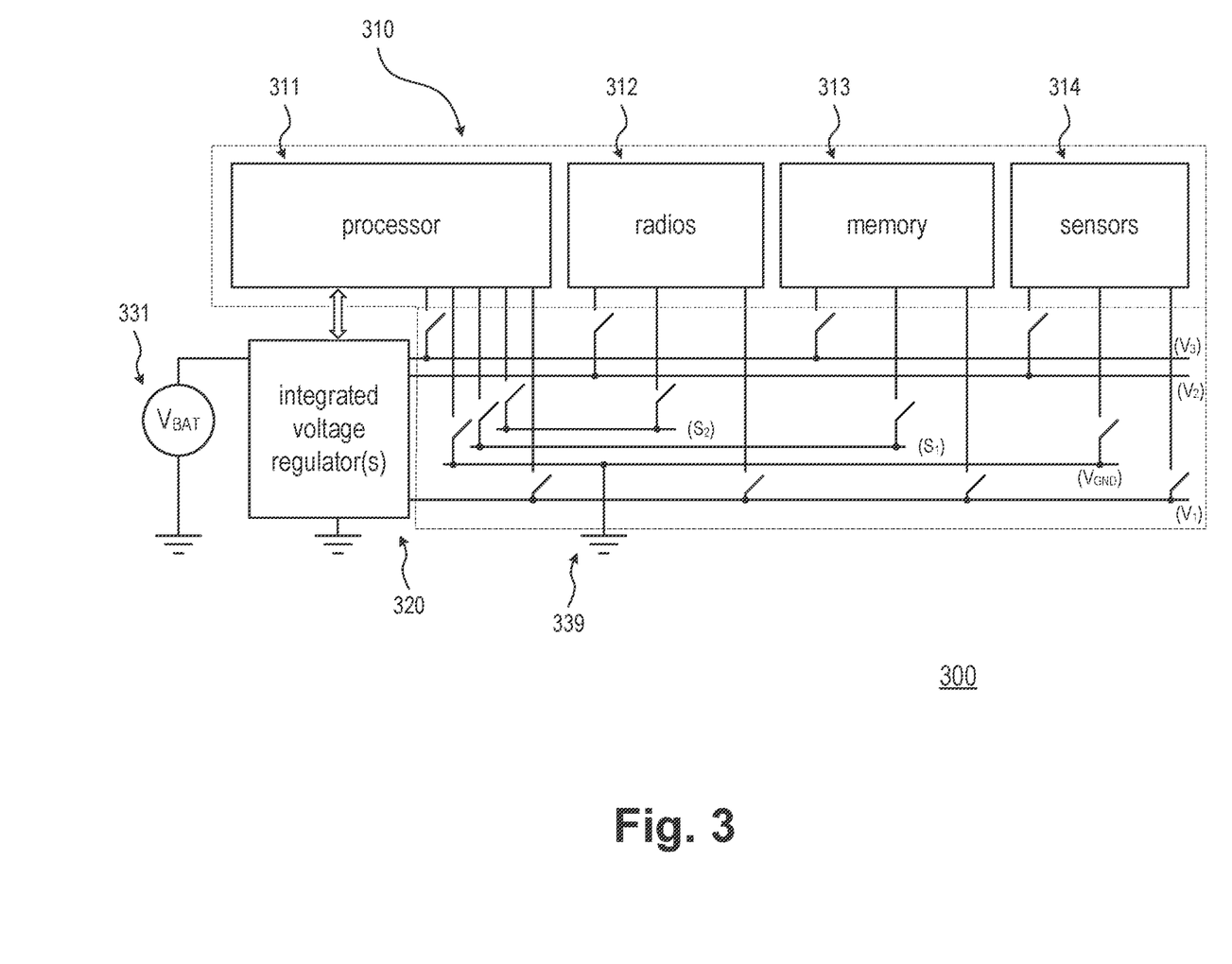
FIG. 3 illustrates components of a system having multiple power rails with power and ground switches, in accordance with some embodiments of the disclosure.

FIG. 3 illustrates components of a system having multiple power rails with power and ground switches, in accordance with some embodiments of the disclosure. A system 300 (which may be an embedded system) may comprise an interposer interconnect element 310, one or more voltage regulators 320, a power supply 331 (e.g., a supply for a battery voltage $V_{BAT}$), and a ground voltage 339.

Interposer interconnect element 310 may comprise one or more IC components, such as a first IC component 311, a second IC component 312, a third IC component 313, and a fourth IC component 314. System 300 may comprise various electrical connections between its constituent parts. Some electrical connections may carry voltages from voltage regulators 320 (e.g., "$V_1$," "$V_2$," and/or "$V_3$") and/or ground voltage 339 (e.g., "$V_{GND}$") to the IC components. Some electrical connections may comprise signal interfaces, and may carry signaling between the IC components (e.g., data signals and/or control signals). In some embodiments, interposer interconnect element 310 may be programmable, and may implement a programmable interconnect for establishing various electrical connections between the IC components and/or the power supplies.

The various electrical connections may be switchable, such that various supply voltages, signal interfaces, and/or a ground voltage may be switched off (and on) for the IC components. In various embodiments, the switches are integrated into the interposer interconnect element. For some embodiments (such as embodiments in which the switches are integrated into a programmable interposer interconnect element), the switches may be dynamically programmable (instead of merely being used for static routing), and may advantageously enable the opening and closing of switches during active system operation to eliminate all leakage in an IC component. In some embodiments, one switch may be operable to isolate a single IC component from an electrical connection (e.g., a voltage, or a signal interface). In some embodiments, one switch may be operable to isolate more than one IC component from an electrical connection (e.g., a voltage, or a signal interface). For some embodiments, voltage regulators 320 may be integrated onto interposer interconnect element 310, while in other embodiments, voltage regulators may not be integrated onto interposer interconnect element 310.

Accordingly, in various embodiments, switches may be introduced in systems having multiple power supplies and/or multiple signal interfaces. If some or all of the IC components that may be driven by a specific power supply are shut off, then it may advantageously be possible to shut off a voltage regulator driving that power supply. In addition, putting switches on various signals may advantageously facilitate or ensure that leakage through ESD diodes embedded in the included chips may be reduced or eliminated. In some embodiments, an optional pull-up resistor may be incorporated (e.g., between a power supply line and a signal interface), which may depend upon the interface used.

Accordingly, with respect to a variety of embodiments pertaining to FIGS. 2 and 3, an apparatus may comprise an interposer interconnect element (e.g., interposer interconnect element 310), an IC component (e.g., IC components of system 200 or system 300), a first switchable electrical connection, and a second switchable electrical connection. The IC component may be fastened to and electrically connected to the interposer interconnect element. The first switchable electrical connection may be operable to carry a supply voltage from the interposer interconnect element to the IC component, and the second switchable electrical connection may be operable to carry either a ground voltage or a signal interface from the interposer interconnect element to the IC component.

In some embodiments, the first switchable electrical connection and the second switchable electrical connection may be operable to both be open at the same time. For some embodiments, the signal interface may comprise one or more data signals and/or one or more control signals. In some embodiments, the apparatus may comprise a pull-up resistor on the interposer interconnect element coupled between the supply voltage and the signal interface.

For some embodiments, a switch for the second switchable electrical connection may be located on the interconnect substrate. In some embodiments, the interposer interconnect element may be a programmable interposer interconnect element. For some embodiments, a switch for the second switchable electrical connection may be configurable to create an open circuit for the ground voltage, or the signal interface.

In some embodiments, the IC component may be a first IC component, and the second switchable electrical connection may be operable to supply the ground voltage or the signal interface from the interposer interconnect element to both the first IC component and a second IC component. For some embodiments, a switch for the second switchable electrical connection may be configurable to create both an open circuit between the interposer interconnect element and the first IC component, and an open circuit between the interposer interconnect element and the second IC component.

For some embodiments, the supply voltage may be a first supply voltage, and the apparatus may comprise an additional switchable electrical connection to carry a second supply voltage from the interposer interconnect element to the IC component.

Alternatively, with respect to a variety of embodiments pertaining to FIGS. 2 and 3, an apparatus may comprise a programmable interposer interconnect element (e.g., interposer interconnect element 310), an IC component (e.g., IC components of system 200 or system 300), a first electrical connection, a second electrical connection, a first switch, and a second switch. The IC component may be mounted on and electrically connected to the programmable interposer interconnect element. The first electrical connection may be operable to carry a supply voltage from the programmable interposer interconnect element to the IC component. The second electrical connection may be operable to carry an additional supply voltage or a signal interface from the programmable interposer interconnect element to the IC component. The first switch may be operable to disconnect the first electrical connection, and the second switch may be operable to disconnect the second electrical connection.

In some embodiments, the additional supply voltage may comprise a ground voltage or a positive supply voltage. For some embodiments, the signal interface may comprise one or more data signals and/or one or more control signals. In some embodiments, the apparatus may comprise a pull-up resistor on the programmable interposer interconnect element coupled between the supply voltage and the signal interface.

For some embodiments, the second switch may be configurable to disconnect the second electrical connection by creating an open circuit in the second electrical connection. In some embodiments, the IC component may be a first IC component, and the second electrical connection may be operable to supply the additional supply voltage or the signal interface from the programmable interposer interconnect element to both the first IC component and a second IC component.

Figure 4:
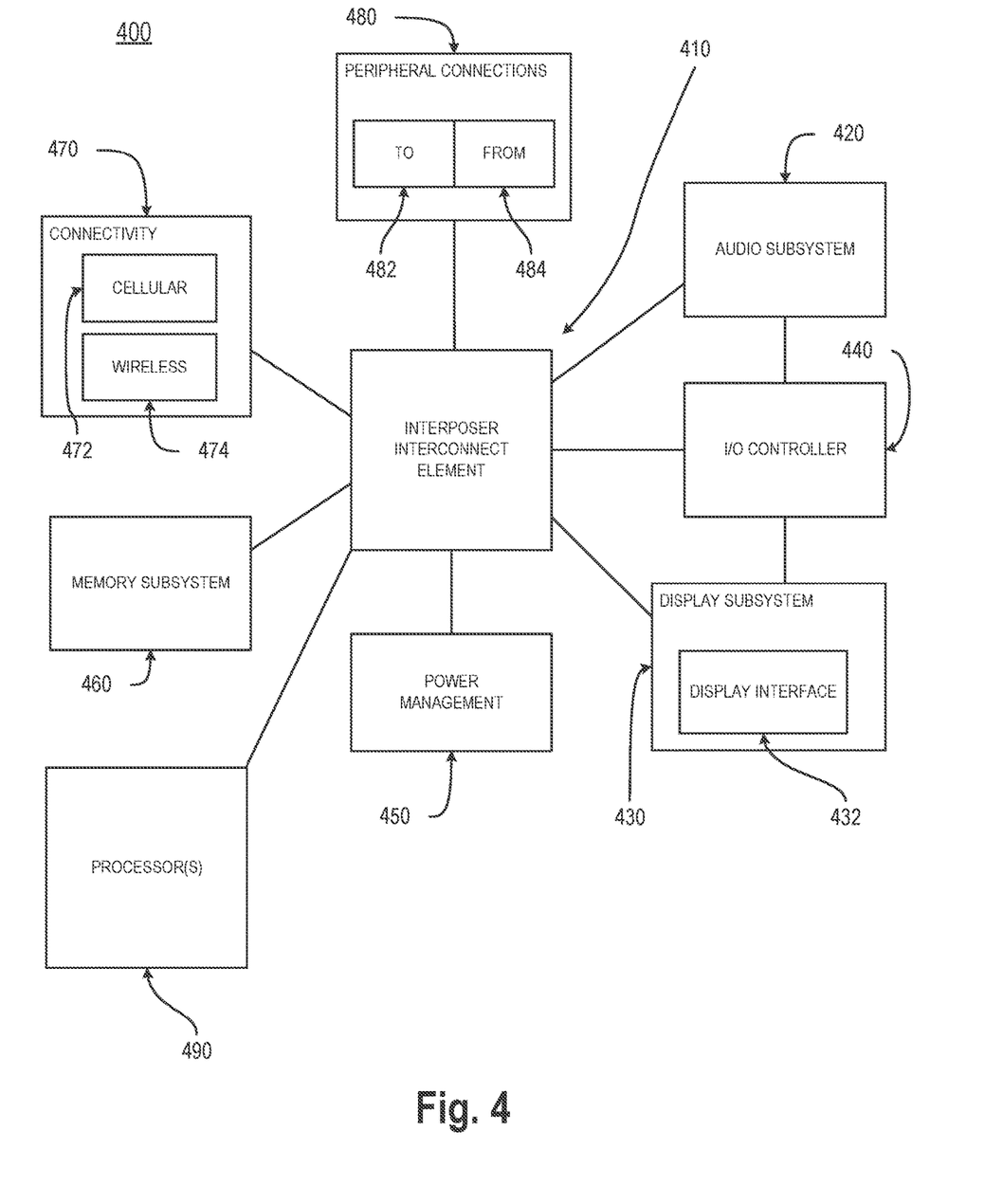
FIG. 4 illustrates a computing device with mechanisms for blocking the propagation of signals to IC components that have been power gated, in accordance with some embodiments of the disclosure.

FIG. 4 illustrates a computing device with mechanisms for blocking the propagation of signals to IC components that have been power gated, in accordance with some embodiments of the disclosure. Computing device 400 may be a computer system, a System-on-a-Chip (SoC), a tablet, a mobile device, a smart device, or a smart phone with mechanisms for blocking the propagation of signals to IC components that have been power gated, in accordance with some embodiments of the disclosure. It will be understood that certain components of computing device 400 are shown generally, and not all components of such a device are shown FIG. 4. Moreover, while some of the components may be physically separate, others may be integrated within the same physical package, or even on the same physical silicon die. Accordingly, the separation between the various components as depicted in FIG. 4 may not be physical in some cases, but may instead be a functional separation. It is also pointed out that those elements of FIG. 4 having the same names or reference numbers as the elements of any other figure can operate or function in any manner similar to that described, but are not limited to such.

In various embodiments, the components of computing device 400 may include any of a interposer interconnect element 410, an audio subsystem 420, a display subsystem 430, an I/O controller 440, a power management component 450, a memory subsystem 460, a connectivity component 470, one or more peripheral connections 480, and one or more processors 490. Interposer interconnect element 410 (which may be substantially similar to interposer interconnect element 310) may be electrically connected to various components within computing device 400. In various embodiments, interposer interconnect element 410 may be dynamically programmable. Some of the various components may be integrated onto interposer interconnect element 410, while other components may be electrically connected to interposer interconnect element 410 but not physically integrated onto interposer interconnect element 410. In some embodiments, interposer interconnect element 410 may include mechanisms for blocking the propagation of signals to IC components that have been power gated, in accordance with some embodiments of the disclosure. In various embodiments, however, any of the components of computing device 400 may include the mechanisms for blocking the propagation of signals to IC components that have been power gated, in accordance with some embodiments of the disclosure. In addition, one or more components of computing device 400 may include an interconnect fabric having a plurality of ports, such as a router, a network of routers, or a Network-on-a-Chip (NoC).

In some embodiments, computing device 400 may be a mobile device which may be operable to use flat surface interface connectors. In one embodiment, computing device 400 may be a mobile computing device, such as a computing tablet, a mobile phone or smart-phone, a wireless-enabled e-reader, or other wireless mobile device. The various embodiments of the present disclosure may also comprise a network interface within 470 such as a wireless interface so that a system embodiment may be incorporated into a wireless device, for example a cell phone or personal digital assistant.

Processors 490 may be general-purpose processor or CPUs (Central Processing Units). In some embodiments, processors 490 may include one or more physical devices, such as microprocessors, application processors, microcontrollers, programmable logic devices, or other processing means. The processing operations performed by processors 490 may include the execution of an operating platform or operating system on which applications and/or device functions may then be executed. The processing operations may also include operations related to one or more of the following: audio I/O; display I/O; power management; connecting computing device 400 to another device; and/or I/O (input/output) with a human user or with other devices.

Audio subsystem 420 may include hardware components (e.g., audio hardware and audio circuits) and software components (e.g., drivers and/or codecs) associated with providing audio functions to computing device 400. Audio functions can include speaker and/or headphone output as well as microphone input. Devices for such functions can be integrated into computing device 400, or connected to computing device 400. In one embodiment, a user interacts with computing device 400 by providing audio commands that are received and processed by processors 490.

Display subsystem 430 may include hardware components (e.g., display devices) and software components (e.g., drivers) that provide a visual and/or tactile display for a user to interact with computing device 400. Display subsystem 430 may include a display interface 432, which may be a particular screen or hardware device used to provide a display to a user. In one embodiment, display interface 432 includes logic separate from processors 490 to perform at least some processing related to the display. In some embodiments, display subsystem 430 includes a touch screen (or touch pad) device that provides both output and input to a user.

I/O controller 440 may include hardware devices and software components related to interaction with a user. I/O controller 440 may be operable to manage hardware that is part of audio subsystem 420 and/or display subsystem 430. Additionally, I/O controller 440 may be a connection point for additional devices that connect to computing device 400, through which a user might interact with the system. For example, devices that can be attached to computing device 400 might include microphone devices, speaker or stereo systems, video systems or other display devices, keyboard or keypad devices, or other I/O devices for use with specific applications such as card readers or other devices.

As mentioned above, I/O controller 440 can interact with audio subsystem 420 and/or display subsystem 430. For example, input through a microphone or other audio device can provide input or commands for one or more applications or functions of computing device 400. Additionally, audio output can be provided instead of, or in addition to, display output. In another example, if display subsystem 430 includes a touch screen, the display device may also act as an input device, which can be at least partially managed by I/O controller 440. There can also be additional buttons or switches on computing device 400 to provide I/O functions managed by I/O controller 440.

In some embodiments, I/O controller 440 manages devices such as accelerometers, cameras, light sensors or other environmental sensors, or other hardware that can be included in computing device 400. The input can be part of direct user interaction, and may provide environmental input to the system to influence its operations (such as filtering for noise, adjusting displays for brightness detection, applying a flash for a camera, or other features).

Power management component 450 may include hardware components (e.g., power management devices and/or circuitry) and software components (e.g., drivers and/or firmware) associated with managing battery power usage, battery charging, and features related to power saving operation.

Memory subsystem 460 may include one or more memory devices for storing information in computing device 400. Memory subsystem 460 can include nonvolatile memory devices (whose state does not change if power to the memory device is interrupted) and/or volatile memory devices (whose state is indeterminate if power to the memory device is interrupted). Memory subsystem 460 can store application data, user data, music, photos, documents, or other data, as well as system data (whether long-term or temporary) related to the execution of the applications and functions of computing device 400.

Some portion of memory subsystem 460 may also be provided as a non-transitory machine-readable medium for storing the computer-executable instructions (e.g., instructions to implement any other processes discussed herein). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity component 470 may include a network interface, such as a cellular interface 472 or a wireless interface 474 (so that an embodiment of computing device 400 may be incorporated into a wireless device such as a cellular phone or a personal digital assistant). In some embodiments, connectivity component 470 includes hardware devices (e.g., wireless and/or wired connectors and communication hardware) and software components (e.g., drivers and/or protocol stacks) to enable computing device 400 to communicate with external devices. Computing device 400 could include separate devices, such as other computing devices, wireless access points or base stations, as well as peripherals such as headsets, printers, or other devices.

In some embodiments, connectivity component 470 can include multiple different types of network interfaces, such as one or more wireless interfaces for allowing processors 490 to communicate with another device. To generalize, computing device 400 is illustrated with cellular interface 472 and wireless interface 474. Cellular interface 472 refers generally to wireless interfaces to cellular networks provided by cellular network carriers, such as provided via GSM or variations or derivatives, CDMA (code division multiple access) or variations or derivatives, TDM (time division multiplexing) or variations or derivatives, or other cellular service standards. Wireless interface 474 refers generally to non-cellular wireless interfaces, and can include personal area networks (such as Bluetooth, Near Field, etc.), local area networks (such as Wi-Fi), and/or wide area networks (such as WiMax), or other wireless communication.

Peripheral connections 480 may include hardware interfaces and connectors, as well as software components (e.g., drivers and/or protocol stacks) to make peripheral connections. It will be understood that computing device 400 could both be a peripheral device to other computing devices (via "to" 482), as well as have peripheral devices connected to it (via "from" 484). The computing device 400 may have a "docking" connector to connect to other computing devices for purposes such as managing content on computing device 400 (e.g., downloading and/or uploading, changing, synchronizing). Additionally, a docking connector can allow computing device 400 to connect to certain peripherals that allow computing device 400 to control content output, for example, to audiovisual or other systems.

In addition to a proprietary docking connector or other proprietary connection hardware, computing device 400 can make peripheral connections 480 via common or standards-based connectors. Common types of connectors can include a Universal Serial Bus (USB) connector (which can include any of a number of different hardware interfaces), a DisplayPort or MiniDisplayPort (MDP) connector, a High Definition Multimedia Interface (HDMI) connector, a Firewire connector, or other types of connectors.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to IC components and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A machine-readable storage medium having machine-executable instructions stored there on that, when executed, cause one or more machines to perform a method comprising:
   closing a first switchable electrical connection, wherein the first switchable electrical connection carries a supply voltage from an interposer interconnect element to an integrated circuit (IC) component fastened to and electrically connected to the interposer interconnect element; and
   closing a second switchable electrical connection, wherein the second switchable electrical connection carries a one or more data signal and one or more control signals from the interposer interconnect element to the IC component, and wherein the first switchable electrical connection and the second switchable electrical connection are closed in a sequence such that the first switchable electrical connection is to close before the second switchable electrical connection.

2. The machine-readable storage medium of claim 1 having further machine-executable instructions stored there on that, when executed, cause the one or more machines to perform a further method comprising:
   opening the first switchable electrical connection and the second switchable electrical connection at substantially a same time.

3. The machine-readable storage medium of claim 1 having further machine-executable instructions stored there on that, when executed, cause the one or more machines to perform a further method comprising:
   programming the interposer interconnect element.

4. The machine-readable storage medium of claim 1 having further machine-executable instructions stored there on that, when executed, cause the one or more machines to perform a further method comprising:
   dynamically programming the interposer interconnect element.

5. The machine-readable storage medium of claim 1 having further machine-executable instructions stored there on that, when executed, cause the one or more machines to perform a further method comprising:
   closing the first switchable electrical connection after closing the second switchable electrical connection.

6. The machine-readable storage medium of claim 1 having further machine-executable instructions stored there on that, when executed, cause the one or more machines to perform a further method comprising:
   closing a third switchable electrical connection, wherein the third switchable electrical connection is to carry from the interposer interconnect element to the IC component a ground voltage.

7. The machine-readable storage medium of claim 6 having further machine-executable instructions stored there on that, when executed, cause the one or more machines to perform a further method comprising:
   closing the third switchable electrical connection prior to closing the second switchable electrical connection.

8. The machine-readable storage medium of claim 1, wherein the interposer interconnect element is coupled to a pull-up resistor, which is coupled to a power supply line and a signal interface, and wherein the power supply line is coupled to the first switchable electrical connection, and wherein the signal interface is coupled to the second switchable electrical connection.

9. The machine-readable storage medium of claim 8, wherein the power supply line is coupled to a battery.

10. An apparatus comprising:
    an interposer interconnect element;
    an integrated circuit (IC) component fastened to and electrically coupled to the interposer interconnect element; and
    at least three switches coupled to the interposer interconnect element, wherein the at least three switches include a first switch, a second switch, and a third switch, wherein the first switch is operable to provide a power supply voltage to the IC component, wherein the second switch is operable to provide a data signal to the IC component, and wherein the third switch is operable to provide a ground to the IC component.

11. The apparatus of claim 10, wherein the first switch, the second switch, and the third switch close in a sequence.

12. The apparatus of claim 10, wherein the third switch is closed prior to the second switch.

13. The apparatus of claim 10, wherein the second switch is closed prior to the first switch.

14. The apparatus of claim 10, wherein the first switch and the second switch are operable to open at substantially a same time.

15. The apparatus of claim 10 comprising a pull-up resistor coupled between a supply line that provides the power supply voltage, and a single line that provides the data signal.

16. The apparatus of claim 10, wherein the interposer interconnect element is dynamically programmable.

17. A system comprising:
an interposer interconnect element;
a processor, a radio, a memory, and a sensor on the interposer interconnect element, and
a first switch operable to provide a power supply voltage to one or more of the processor, the radio, the memory, or the sensor, wherein the interposer interconnect element includes at least two switches including a second switch and a third switch, wherein the second switch is operable to provide a data signal to the processor, and wherein the third switch is operable to provide a ground to the processor.

18. The system of claim 17, wherein the first switch and the second switch are operable to open at substantially a same time.

19. The system of claim 17, wherein the first switch, the second switch, and the third switch close in a sequence.

20. The system of claim 17, wherein the third switch is closed prior to the second switch, wherein the second switch is closed prior to the first switch.

* * * * *